United States Patent
Li et al.

(10) Patent No.: US 10,403,743 B2
(45) Date of Patent: Sep. 3, 2019

(54) MANUFACTURING METHOD OF OXIDE SEMICONDUCTOR DEVICE

(71) Applicant: UNITED MICROELECTRONICS CORP., Hsin-Chu (TW)

(72) Inventors: Xiang Li, Singapore (SG); Shao-Hui Wu, Singapore (SG); Hsiao Yu Chia, Singapore (SG); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 174 days.

(21) Appl. No.: 15/655,881

(22) Filed: Jul. 20, 2017

(65) Prior Publication Data

US 2019/0027589 A1 Jan. 24, 2019

(51) Int. Cl.
*H01L 29/786* (2006.01)
*H01L 29/66* (2006.01)
*H01L 21/465* (2006.01)

(52) U.S. Cl.
CPC ...... *H01L 29/66969* (2013.01); *H01L 21/465* (2013.01); *H01L 29/7869* (2013.01)

(58) Field of Classification Search
CPC .................................................. H01L 29/7869
See application file for complete search history.

(56) References Cited

U.S. PATENT DOCUMENTS

| | | | |
|---|---|---|---|
| 2006/0148216 A1 | 7/2006 | Takayama | |
| 2007/0063920 A1* | 3/2007 | Shionoiri | H01Q 1/2225 343/895 |
| 2015/0123121 A1* | 5/2015 | Hanaoka | H01L 29/78606 257/43 |
| 2015/0179810 A1 | 6/2015 | Yamazaki | |
| 2015/0302877 A1* | 10/2015 | Tang | G11B 5/72 428/835 |
| 2017/0263774 A1* | 9/2017 | Matsubayashi | H01L 29/7869 |
| 2018/0069098 A1* | 3/2018 | Deng | H01L 29/66757 |

FOREIGN PATENT DOCUMENTS

WO  WO 2014165005  10/2014

* cited by examiner

*Primary Examiner* — Peniel M Gumedzoe
*Assistant Examiner* — Christopher A Johnson
(74) *Attorney, Agent, or Firm* — Winston Hsu

(57) ABSTRACT

A manufacturing method of an oxide semiconductor device includes the following steps. A first oxide semiconductor layer is formed on a substrate. A gate insulation layer is formed on the first oxide semiconductor layer. A first flattening process is performed on a top surface of the first oxide semiconductor layer before the step of forming the gate insulation layer. A roughness of the top surface of the first oxide semiconductor layer after the first flattening process is smaller than the roughness of the top surface of the first oxide semiconductor layer before the first flattening process.

18 Claims, 7 Drawing Sheets

MANUFACTURING METHOD OF OXIDE SEMICONDUCTOR DEVICE

BACKGROUND OF THE INVENTION

1. Field of the Invention

The present invention relates to a manufacturing method of an oxide semiconductor device, and more particularly, to a manufacturing method including a flattening process for reducing a surface roughness of an oxide semiconductor layer.

2. Description of the Prior Art

Oxide semiconductor materials, such as indium gallium zinc oxide (IGZO), have been applied in thin film transistors (TFTs) of display devices and field effect transistors (FETs) used in integrated circuits because of properties such as high mobility and low leakage current. Generally, the oxide semiconductor layer may be formed by a sputtering process, and the surface roughness of the oxide semiconductor layer is much larger than that of a substrate where the oxide semiconductor layer is deposited because of the sputtering process. High interface roughness between the oxide semiconductor layer and a gate insulation layer may cause deterioration of device reliability performances, such as breakdown electric field ($E_{BD}$) and time-dependent dielectric breakdown (TDDB). Accordingly, the surface roughness of the oxide semiconductor layer has to be reduced for improving the reliability performances of the oxide semiconductor device.

SUMMARY OF THE INVENTION

A manufacturing method of an oxide semiconductor device is provided in the present invention. A flattening process is performed on a top surface of an oxide semiconductor layer for reducing the surface roughness of the oxide semiconductor layer before a step of forming a gate insulation layer on the oxide semiconductor layer. The interface roughness between the oxide semiconductor layer and the gate insulation layer is improved by the flattening process, and the reliability performances of the oxide semiconductor device may be enhanced accordingly.

According to an embodiment of the present invention, a manufacturing method of an oxide semiconductor device is provided. The manufacturing method includes the following steps. A first oxide semiconductor layer is formed on a substrate. A gate insulation layer is formed on the first oxide semiconductor layer. A first flattening process is performed on a top surface of the first oxide semiconductor layer before the step of forming the gate insulation layer. A roughness of the top surface of the first oxide semiconductor layer after the first flattening process is smaller than the roughness of the top surface of the first oxide semiconductor layer before the first flattening process.

According to another embodiment of the present invention, a manufacturing method of an oxide semiconductor device is provided. The manufacturing method includes the following steps. A first oxide semiconductor layer is formed on a substrate. A gate insulation layer is formed on the first oxide semiconductor layer. A first flattening process is performed on a top surface of the first oxide semiconductor layer before the step of forming the gate insulation layer. A roughness of the top surface of the first oxide semiconductor layer is smaller than 2 nm after the first flattening process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 and FIG. 2 are schematic drawings illustrating a manufacturing method of an oxide semiconductor device according to a first embodiment of the present invention, wherein FIG. 2 is a schematic drawing in a step subsequent to FIG. 1.

FIGS. 4-6 are schematic drawings illustrating the manufacturing method of the oxide semiconductor device according to the second embodiment of the present invention, wherein FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

FIG. 11 and FIG. 12 are schematic drawings illustrating the manufacturing method of the oxide semiconductor device according to the fifth embodiment of the present invention, wherein FIG. 12 is a schematic drawing in a step subsequent to FIG. 11.

DETAILED DESCRIPTION

Figure 1:
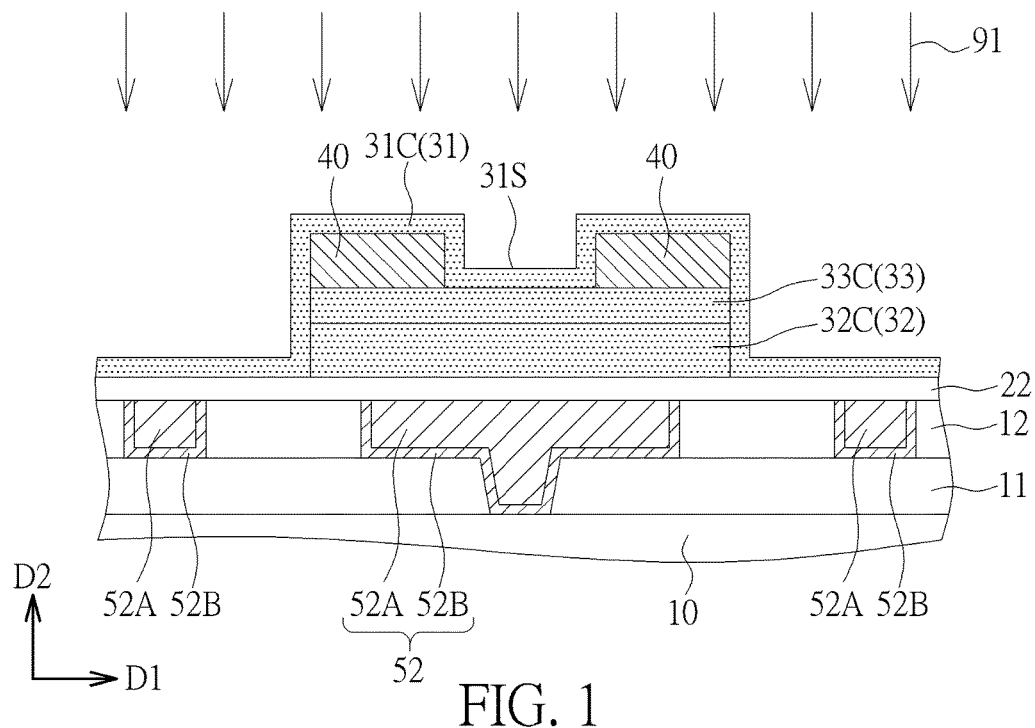
Figure 2:
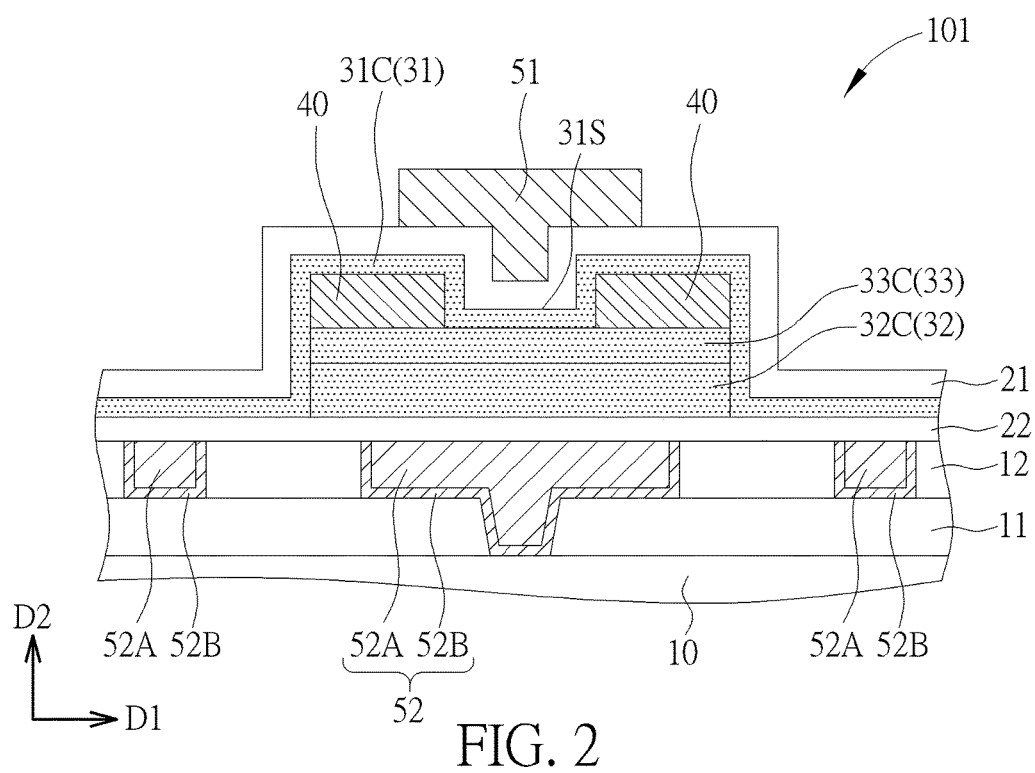

Please refer to FIG. 1 and FIG. 2. FIG. 1 and FIG. 2 are schematic drawings illustrating a manufacturing method of an oxide semiconductor device according to a first embodiment of the present invention. As shown in FIG. 1 and FIG. 2, the manufacturing method of the oxide semiconductor device in this embodiment includes the following steps. A first oxide semiconductor layer 31 is formed on a substrate 10, and a gate insulation layer (such as a first gate insulation layer 21 shown in FIG. 2) is formed on the first oxide semiconductor layer 31. A first flattening process 91 is performed on a top surface (such as a first top surface 31S shown in FIG. 1) of the first oxide semiconductor layer 31 before the step of forming the first gate insulation layer 21. A roughness of the first top surface 31S of the first oxide semiconductor layer 31 after the first flattening process 91 is smaller than the roughness of the first top surface 31S of the first oxide semiconductor layer 31 before the first flattening process 91. In some embodiments, the roughness of the first top surface 31S of the first oxide semiconductor layer 31 may be smaller than 2 nm after the first flattening process 91. Accordingly, the interface roughness between the first oxide semiconductor layer 31 and the first gate insulation layer 21 may be improved by the first flattening process 91, and the reliability performances of the oxide semiconductor device may be enhanced.

In some embodiments, the substrate 10 may include a semiconductor substrate or a non-semiconductor substrate. The semiconductor substrate may include a silicon substrate, a silicon germanium substrate, or a silicon-on-insulator (SOI) substrate, and the non-semiconductor substrate may include a glass substrate, a plastic substrate, or a ceramic substrate, but not limited thereto. For example, when the substrate 10 is a semiconductor substrate, a plurality of silicon-based field effect transistors (not shown) may be formed on the semiconductor substrate before the step of forming the oxide semiconductor device, but not limited thereto. In some embodiments, source/drain electrodes 40 may be formed on the substrate 10 before the step of forming the first oxide semiconductor layer 31. A part of the first oxide semiconductor layer 31 may be formed between the source/drain electrodes 40 in a horizontal direction (such as a first direction D1 shown in FIG. 1), and a part of the first oxide semiconductor layer 31 may be formed on the source/drain electrodes 40 in a vertical direction (such as a second direction D2 shown in FIG. 1), but not limited thereto. Additionally, a first gate electrode 51 may be formed on the first gate insulation layer 21. In some embodiments, another oxide semiconductor layer may be formed on the substrate 10 before the step of forming the source/drain electrodes 40. For example, a second oxide semiconductor layer 32 may be formed on the substrate 10 and a third oxide semiconductor layer 33 may be formed on the second oxide semiconductor layer 32 before the step of forming the source/drain electrodes 40. At least a part of the first oxide semiconductor layer 31 may be formed on the second oxide semiconductor layer 32 and the third oxide semiconductor layer 33. At least apart of the source/drain electrodes 40 may be formed on the third oxide semiconductor layer 33, but not limited thereto.

In some embodiments, a second gate insulation layer 22 and a second gate electrode 52 may be formed under the second oxide semiconductor layer 32. In some embodiments, the first gate electrode 51, the second gate electrode 52, and the source/drain electrodes 40 may include aluminum (Al), copper (Cu), titanium aluminide (TiAl), titanium (Ti), titanium nitride (TiN), tantalum (Ta), tantalum nitride (TaN), titanium aluminum oxide (TiAlO), or other appropriate conductive materials. In some embodiments, a plurality of interlayer dielectrics, such as a dielectric layer 11 and a dielectric layer 12 may be formed on the substrate 10 before the step of forming the second gate electrode 52, and the second gate electrode 52 be formed by filling a recess in the dielectric layer 12 and/or the dielectric layer 11 with a barrier layer 52B and a conductive material 52A, but not limited thereto. The dielectric layers 11 and 12 may include silicon oxynitride, silicon oxide, or other suitable dielectric materials. The barrier layer 52B may include titanium nitride, tantalum nitride, or other suitable barrier materials, and the conductive material 52A may include materials with relatively lower resistivity, such as copper, aluminum, or tungsten, but not limited thereto. The second gate electrode 52 formed in the recess may be connected downward to other units or circuits (not shown) in the substrate 10, but not limited thereto. In other words, the second gate electrode 52 may be formed by the process of forming an interconnection structure on the substrate 10, and the second gate insulation layer 22 may be formed on the second gate electrode 52 and the dielectric layer 12. An oxide semiconductor device 101 shown in FIG. 2 may be formed by the manufacturing method described above. The oxide semiconductor device 101 may be regarded as a dual gate transistor structure, but the present invention is not limited thereto. The manufacturing method the present invention may also be used to form other types of oxide semiconductor devices, such as a top gate transistor or other kinds of multiple gate transistors.

In some embodiments, the first gate insulation layer 21 and the second gate insulation layer 22 may respectively include silicon oxide, silicon oxynitride, a high dielectric constant (high-k) material, or other appropriate dielectric materials. The high-k material mentioned above may include hafnium oxide ($HfO_2$), hafnium silicon oxide (HfSiO$_4$), hafnium silicon oxynitride (HfSiON), aluminum oxide ($Al_2O_3$), tantalum oxide ($Ta_2O_5$), zirconium oxide ($ZrO_2$), or other appropriate high-k materials. The first oxide semiconductor layer 31, the second oxide semiconductor layer 32, and the third oxide semiconductor layer 33 may include II-VI compounds (such as zinc oxide, ZnO), II-VI compounds doped with alkaline-earth metals (such as zinc magnesium oxide, ZnMgO), II-VI compounds doped with IIIA compounds (such as indium gallium zinc oxide, IGZO), II-VI compounds doped with VA compounds (such as stannum stibium oxide, SnSbO2), II-VI compounds doped with VIA compounds (such as zinc selenium oxide, ZnSeO), II-VI compounds doped with transition metals (such as zinc zirconium oxide, ZnZrO), or other oxide semiconductor materials composed of mixtures of the above-mentioned materials, but not limited thereto. Additionally, the crystalline conditions of the first oxide semiconductor layer 31, the second oxide semiconductor layer 32, and the third oxide semiconductor layer 33 are also not limited. For example, the first oxide semiconductor layer 31, the second oxide semiconductor layer 32, and the third oxide semiconductor layer 33 may be amorphous IGZO (a-IGZO), crystal IGZO (c-IGZO), or C-axis aligned crystal IGZO (CAAC-IGZO). In some embodiments, the third oxide semiconductor layer 33 may be an oxide semiconductor layer having relatively lower contact resistance between the source/drain electrodes 40 and the third oxide semiconductor layer 33 in comparison with the second oxide semiconductor layer 32, but not limited thereto. In other words, components of first oxide semiconductor layer 31, the second oxide semiconductor layer 32, and the third oxide semiconductor layer 33 may be different from one another for some design considerations. For example, an electron mobility of the first oxide semiconductor layer 31 and an electron mobility of the second oxide semiconductor layer 32 may be higher than an electron mobility of the third oxide semiconductor layer 33 for enhancing the on-current of the oxide semiconductor device 101, but not limited thereto. In some embodiments, the first oxide semiconductor layer 31 and the second oxide semiconductor layer 32 may also be used as a barrier layer for blocking substance such as silicon from entering the third oxide semiconductor layer 33. Therefore, the concentration of impurities in the third oxide semiconductor layer 33 or in the vicinity of the interface between the first oxide semiconductor layer 31 and the third oxide semiconductor layer 33 and/or between the second oxide semiconductor layer 32 and the third oxide semiconductor layer 32 may be reduced.

In some embodiments, the first flattening process 91 may include a plasma treatment or other suitable approaches for reducing the surface roughness of the first oxide semiconductor layer 31. In some embodiments, a gaseous mixture used in the plasma treatment includes xenon (Xe) and/or hydrogen ($H_2$), but not limited thereto. In some embodiments, the Xe plasma may be the main source for inducing the surface migration of the first oxide semiconductor layer 31, and the H2 plasma may be used to mitigate the plasma damage such as Xe ion bombardment. Accordingly, the hydrogen concentration in the gaseous mixture may be lower than the xenon concentration in the gaseous mixture preferably, but not limited thereto. For example, the hydrogen concentration in the gaseous mixture may be lower than or equal to 10%. Additionally, a process temperature of the first flattening process 91 may be lower than or equal to 400° C. for avoiding affecting other components in the substrate 10, but not limited thereto. For example, after the first flattening process 91 using the Xe(90%)/$H_2$(10%) gaseous mixture at 400° C. and adequate pressure (such as 266 Pa), the roughness of the first top surface 31S of the first oxide semiconductor layer 31 may be smaller than 2. The interface roughness between the first oxide semiconductor layer 31 and the first gate insulation layer 21 may be improved by the first flattening process 91, and the reliability performances of the oxide semiconductor device 101, such as breakdown electric field ($E_{BD}$) and time-dependent dielectric breakdown (TDDB), may be enhanced accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 3:
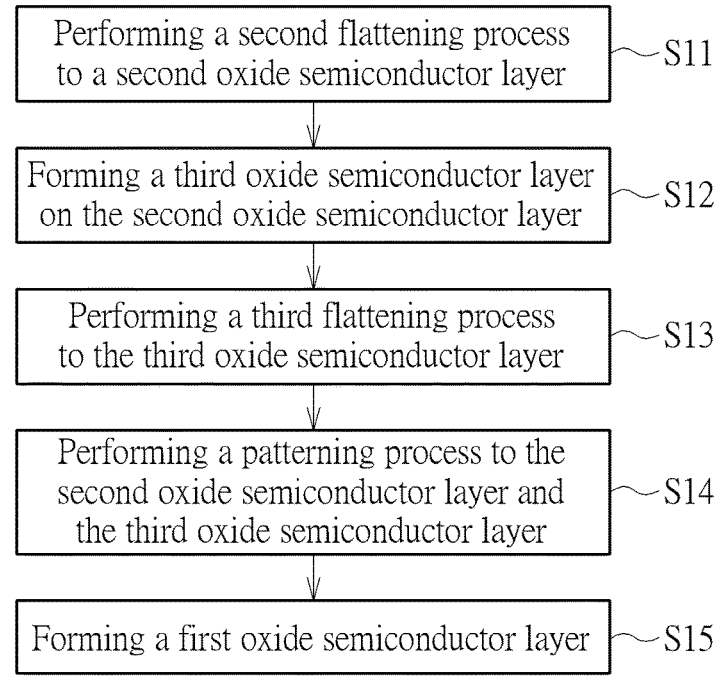
FIG. 3 is a flow chart of a manufacturing method of an oxide semiconductor device according to a second embodiment of the present invention.
Figure 4:
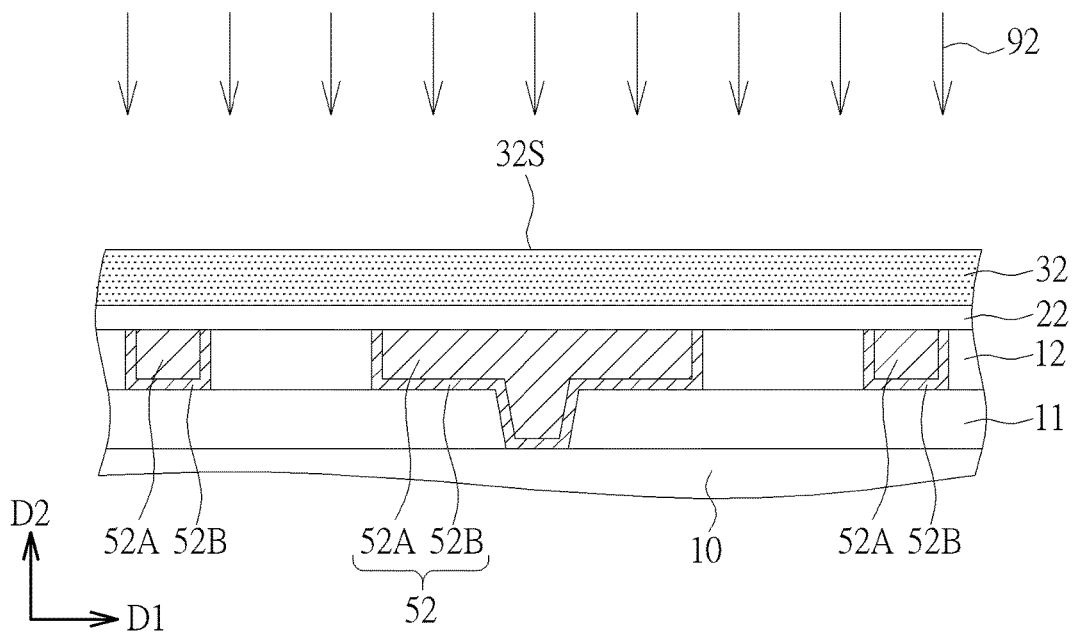
Figure 5:
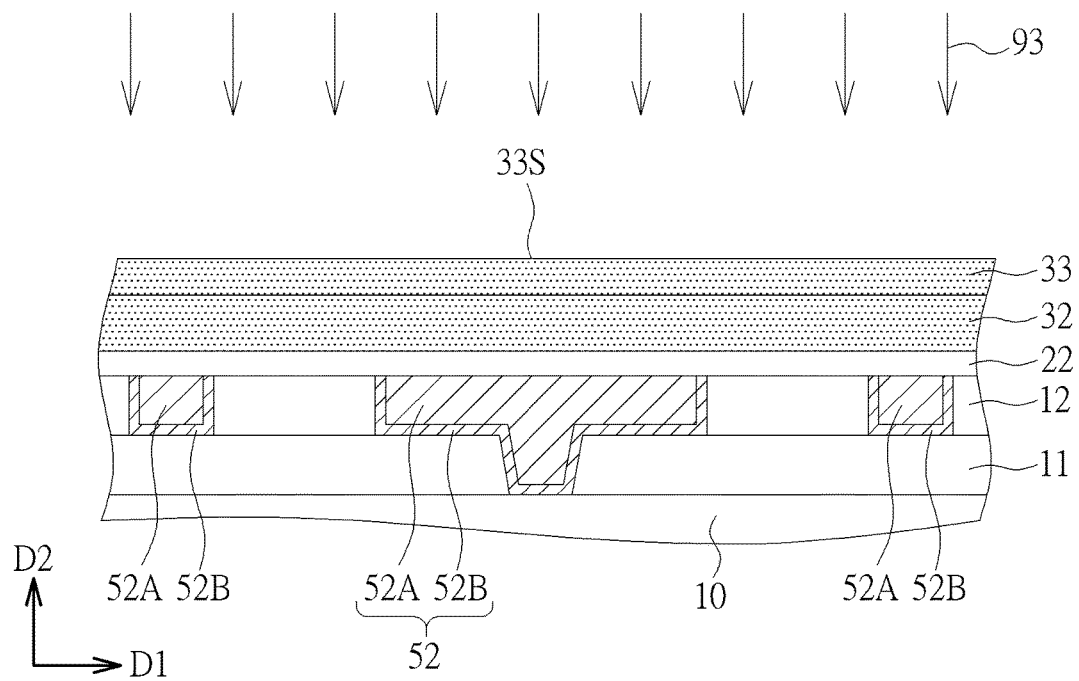
Figure 6:
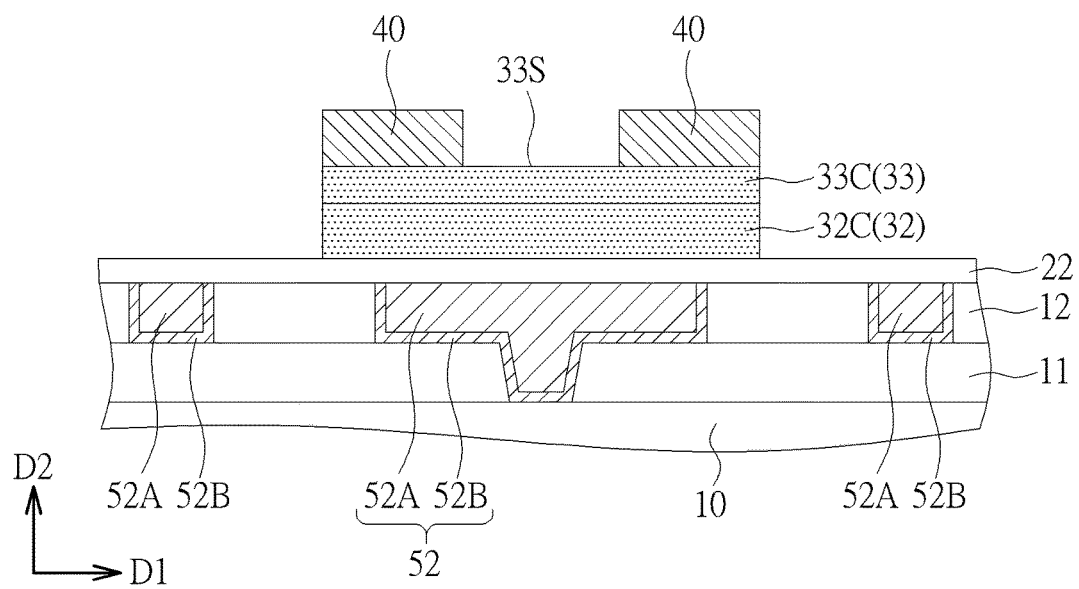

Please refer to FIGS. 3-6 and FIG. 2. FIG. 3 is a flow chart of a manufacturing method of an oxide semiconductor device according to a second embodiment of the present invention, and FIGS. 4-6 are schematic drawings illustrating the manufacturing method of the oxide semiconductor device in this embodiment. FIG. 2 may be regarded as a schematic drawing in a step subsequent to FIG. 6. The difference between this embodiment and the first embodiment mentioned above is that, as shown in FIGS. 3-5, in steps S11, a second flattening process 92 is performed on a top surface (such as a second top surface 32S shown in FIG. 4) of the second oxide semiconductor layer 32 before the step of forming the first oxide semiconductor layer. A roughness of the second top surface 32S of the second oxide semiconductor layer 32 after the second flattening process 92 may be smaller than the roughness of the second top surface 32S of the second oxide semiconductor layer 32 before the second flattening process 92. In some embodiments, the roughness of the second top surface 32S of the second oxide semiconductor layer 32 may be smaller than 2 nm after the second flattening process 92, but not limited thereto. In step S12, the third oxide semiconductor layer 33 is then formed on the second semiconductor layer 32. In step S13, a third flattening process 93 is performed on a top surface (such as a third top surface 33S shown in FIG. 5) of the third oxide semiconductor layer 33 before the step of forming the first oxide semiconductor layer. A roughness of the third top surface 33S of the third oxide semiconductor layer 33 after the third flattening process 93 may be smaller than the roughness of the third top surface 30S of the third oxide semiconductor layer 33 before the third flattening process 93. In some embodiments, the roughness of the third top surface 33S of the third oxide semiconductor layer 33 may be smaller than 2 nm after the third flattening process 93, but not limited thereto. The second flattening process 92 and the third flattening process 93 may be similar to the first flattening process mentioned in the first embodiment. For example, the second flattening process 92 and the third flattening process 93 may include a plasma treatment respectively, and a gaseous mixture used in the plasma treatment may include xenon and/or hydrogen, but not limited thereto.

As shown in FIG. 3 and FIG. 6, in step S14, a patterning process may be performed to the second oxide semiconductor layer 32 and the third oxide semiconductor layer 33 before the step of forming the first oxide semiconductor layer. The second oxide semiconductor layer 32 and the third oxide semiconductor layer 33 may be patterned to be a second oxide semiconductor channel layer 32C and a third oxide semiconductor channel layer 33C respectively. Therefore, in some embodiments, the third flattening process mentioned above may be performed before the patterning process of forming the second oxide semiconductor channel layer 32C and the third oxide semiconductor channel layer 33C, but not limited thereto. Additionally, the source/drain electrodes 40 may be formed after the patterning process or be formed before the patterning process according to other considerations. As shown in FIG. 3 and FIG. 2, in step S15, the first oxide semiconductor layer 31 is then formed on the source/drain electrodes 40 and the third oxide semiconductor layer 33. The interface roughness between the first oxide semiconductor layer 31 and the first gate insulation layer 21 may be further improved by the second flattening process and the third flattening process performed on the second oxide semiconductor layer 32 and the third oxide semiconductor layer 33 respectively because at least a part of the first oxide semiconductor layer 31, the second oxide semiconductor layer 32 and the third oxide semiconductor layer 33 are stacked in the second direction D2, and the surface roughness of the second oxide semiconductor layer 32 and the surface roughness of the third oxide semiconductor layer 33 may influence the surface roughness of the first oxide semiconductor layer 31 and the interface roughness between the first oxide semiconductor layer 31 and the first gate insulation layer 21.

Figure 7:
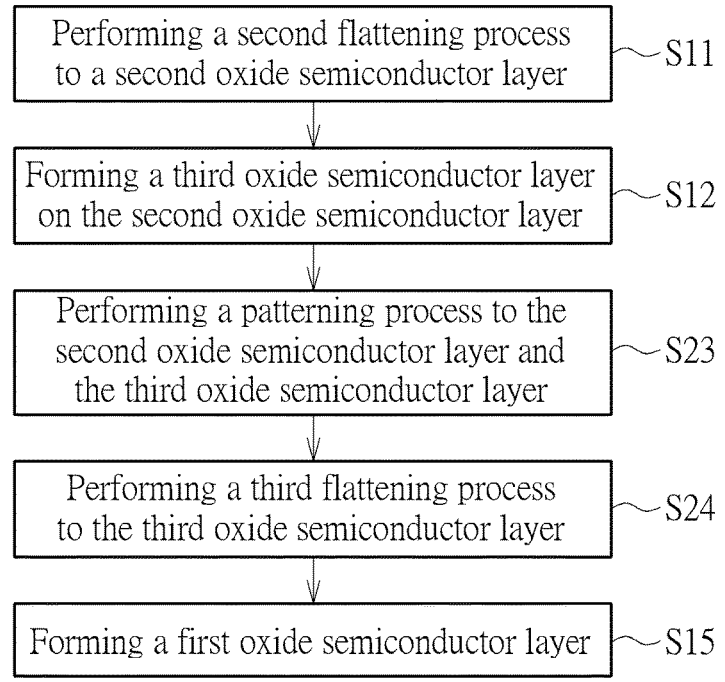
FIG. 7 is a flow chart of a manufacturing method of an oxide semiconductor device according to a third embodiment of the present invention.
Figure 8:
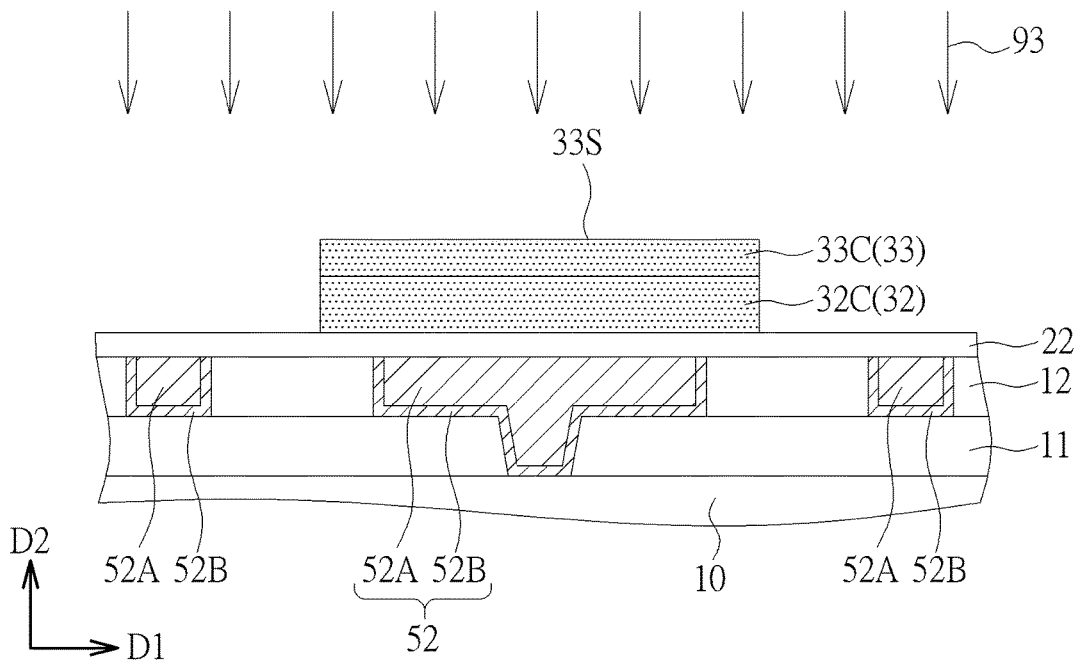
FIG. 8 is a schematic drawing illustrating the manufacturing method of the oxide semiconductor device according to the third embodiment of the present invention.

Please refer to FIG. 7, FIG. 8, and FIG. 2. FIG. 7 is a flow chart of a manufacturing method of an oxide semiconductor device according to a third embodiment of the present invention, and FIG. 8 is a schematic drawing illustrating the manufacturing method of the oxide semiconductor device in this embodiment. FIG. 2 may be regarded as a schematic drawing in a step subsequent to FIG. 8. As shown in FIG. 7, FIG. 8, and FIG. 2, the difference between this embodiment and the second embodiment mentioned above is that in step S23, the patterning process to the second oxide semiconductor layer 32 and the third oxide semiconductor layer 33 may be performed. In step S24, the third flattening process 93 is performed to the third oxide semiconductor layer 33 after the patterning process of forming the second oxide semiconductor channel layer 32C and the third oxide semiconductor channel layer 33C for reducing the influence of the patterning process on the surface roughness of the third oxide semiconductor channel layer 33C and the interface roughness between the third oxide semiconductor channel layer 33C and the first oxide semiconductor layer 31.

Figure 9:
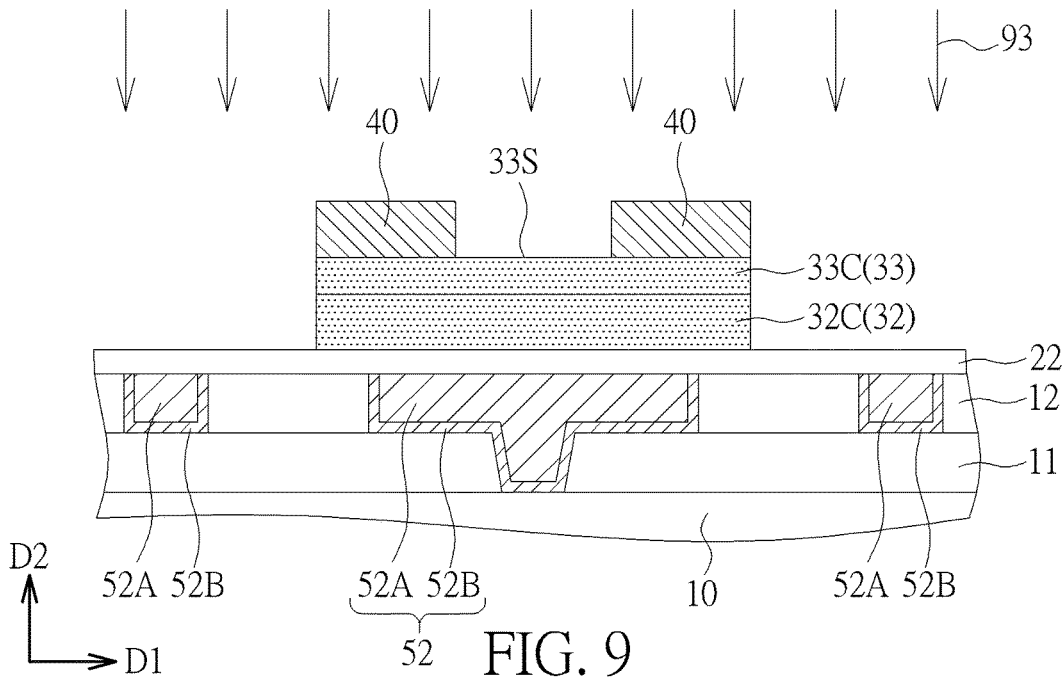
FIG. 9 is a schematic drawing illustrating a manufacturing method of an oxide semiconductor device according to a fourth embodiment of the present invention.

Please refer to FIG. 9 and FIG. 2. FIG. 9 is a schematic drawing illustrating a manufacturing method of an oxide semiconductor device according to a fourth embodiment of the present invention. FIG. 2 may be regarded as a schematic drawing in a step subsequent to FIG. 9. As shown in FIG. 9 and FIG. 2, the difference between this embodiment and the third embodiment mentioned above is that the third flattening process 93 may be performed to the third oxide semiconductor layer 33 after the step of forming the source/drain electrodes 40 for reducing the influence of the process of forming the source/drain electrodes 40 on the interface roughness between the third oxide semiconductor channel layer 33C and the first oxide semiconductor layer 31.

Figure 10:
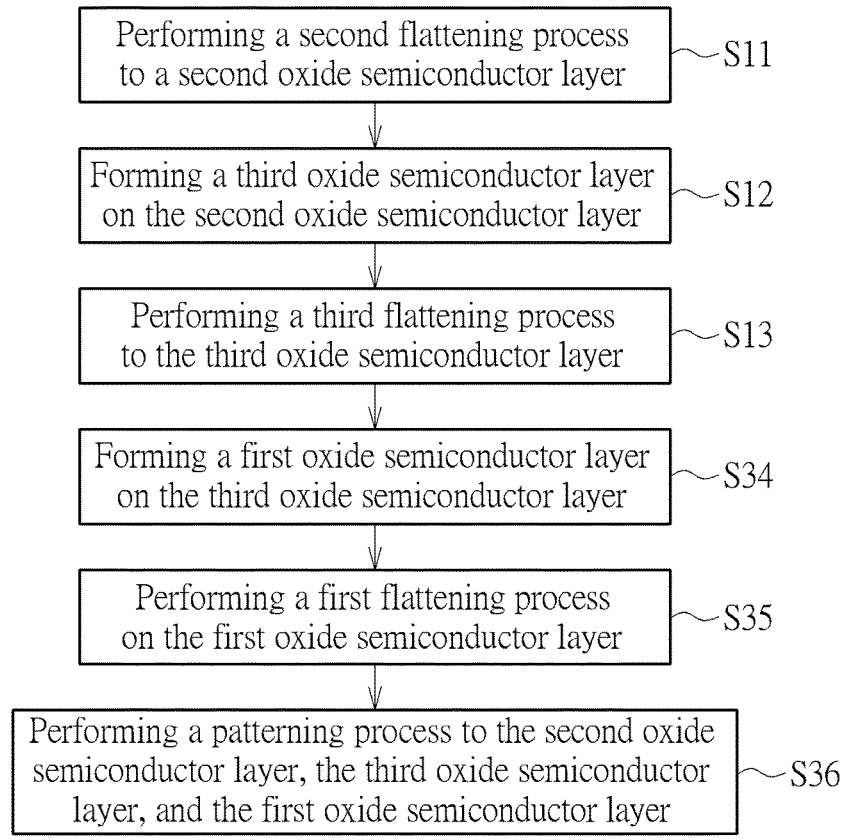
FIG. 10 is a flow chart of a manufacturing method of an oxide semiconductor device according to a fifth embodiment of the present invention.
Figure 11:
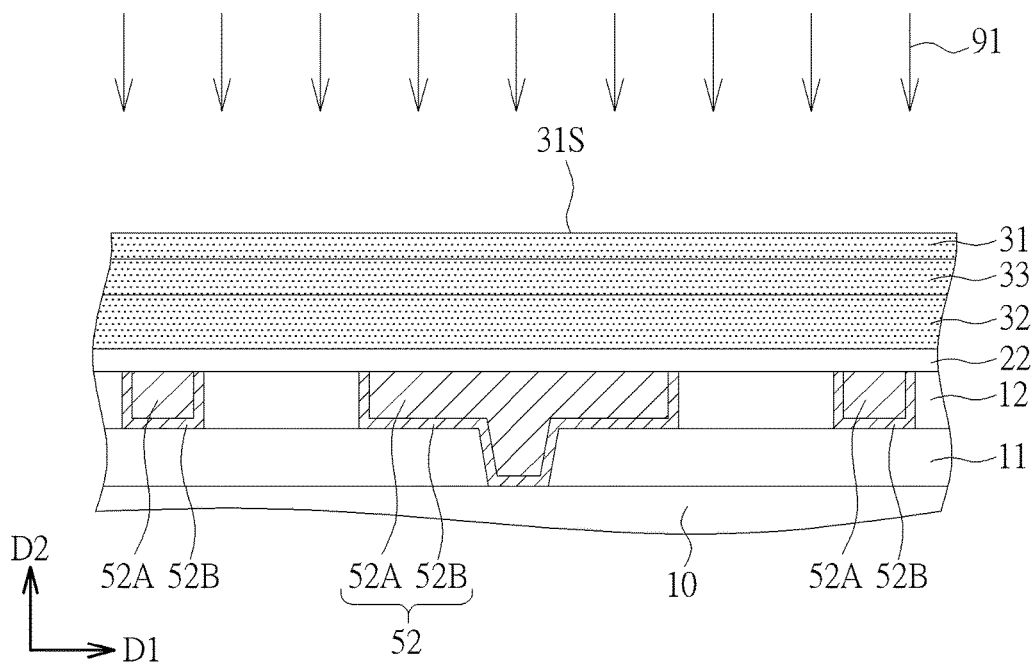
Figure 12:
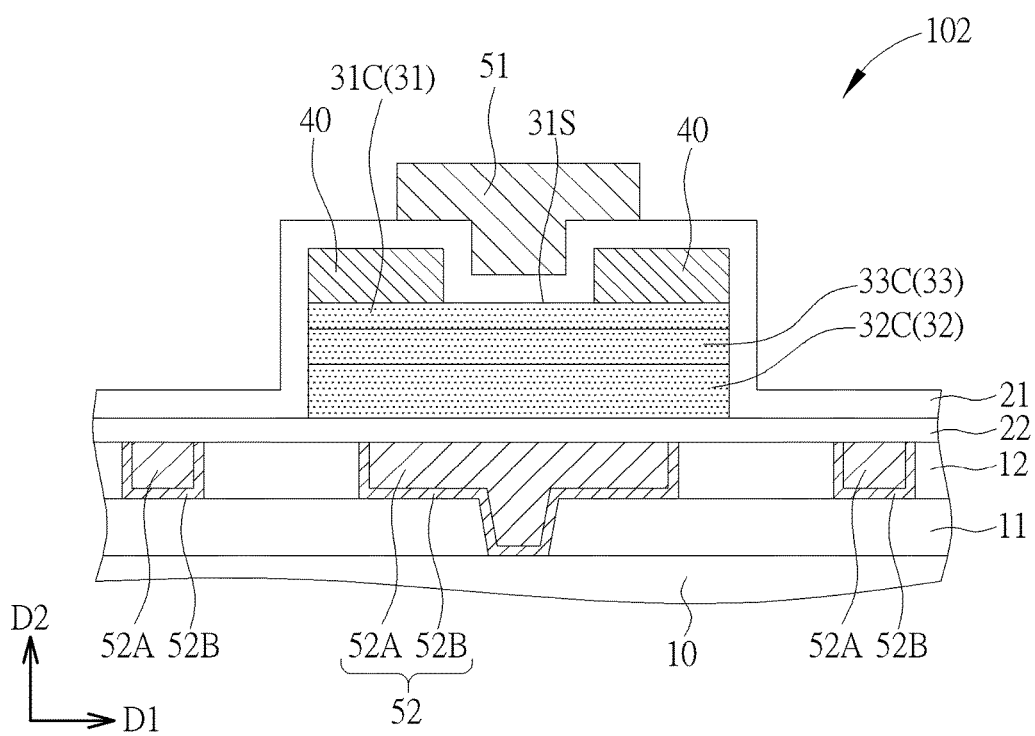

Please refer to FIGS. 10-12. FIG. 10 is a flow chart of a manufacturing method of an oxide semiconductor device 102 according to a fifth embodiment of the present invention. FIG. 11 and FIG. 12 are schematic drawings illustrating the manufacturing method of the oxide semiconductor device in this embodiment. The difference between this embodiment and the second embodiment mentioned above is that, as shown in FIGS. 10-12, in step S34, the first oxide semiconductor layer 31 is formed on the third oxide semiconductor layer 33. In step S35, the first flattening process 91 is performed on the first oxide semiconductor layer 31. In step S36, a patterning process is performed to the first oxide semiconductor layer 31, the third oxide semiconductor layer 33, and the second oxide semiconductor layer 32. The first oxide semiconductor layer 31 may be patterned to be a first oxide semiconductor channel layer 31C on the third oxide semiconductor channel layer 33C. The patterning process of forming the first oxide semiconductor channel layer 31C, the second oxide semiconductor channel layer 32C, and the third oxide semiconductor channel layer 33C may be performed before the step of forming the first gate insulation layer 21 and the first flattening process 91 may be performed before the patterning process. Additionally, the source/drain electrodes 40 in this embodiment may be formed on the first oxide semiconductor layer 31 before the step of forming the first gate insulation layer 21, the first gate insulation layer 21 may be formed on the source/drain electrodes 40 and the first oxide semiconductor channel layer 31C, and the source/drain electrodes 40 may be formed after the first flattening process 91.

Figure 13:
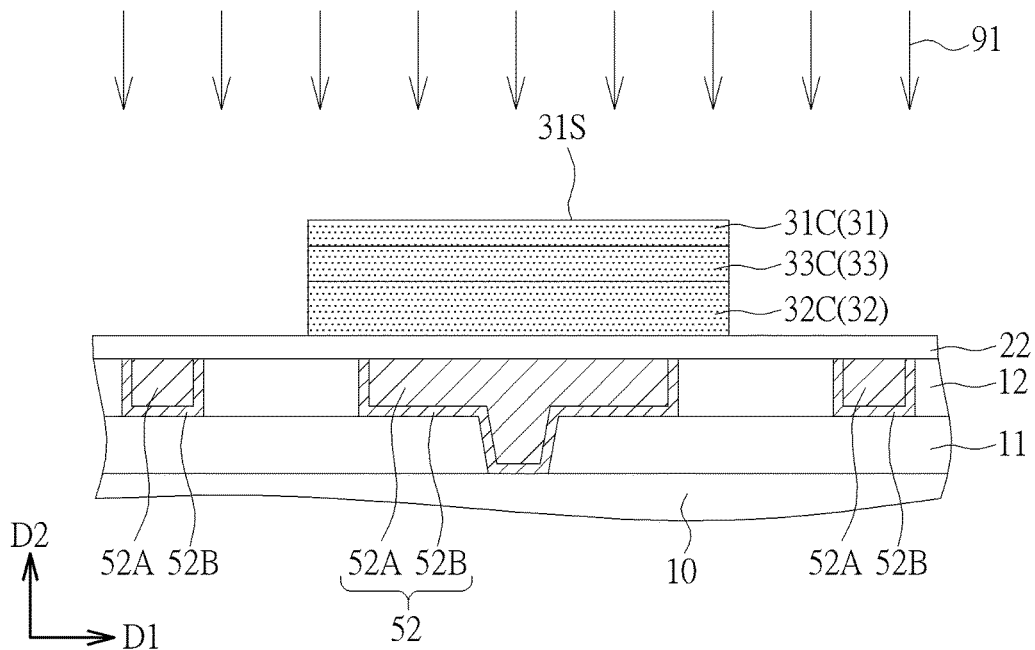
FIG. 13 is a schematic drawing illustrating a manufacturing method of an oxide semiconductor device according to a sixth embodiment of the present invention.

Please refer to FIG. 13. FIG. 13 is a schematic drawing illustrating a manufacturing method of an oxide semiconductor device according to a sixth embodiment of the present invention. As shown in FIG. 13, the difference between this embodiment and the fifth embodiment mentioned above is that the first flattening process 91 may be performed after the patterning process of forming the first oxide semiconductor channel layer 31C, the second oxide semiconductor channel layer 32C, and the third oxide semiconductor channel layer 33C for reducing the influence of the patterning process on the roughness of the first top surface 31S of the first oxide semiconductor channel layer 31C.

Figure 14:
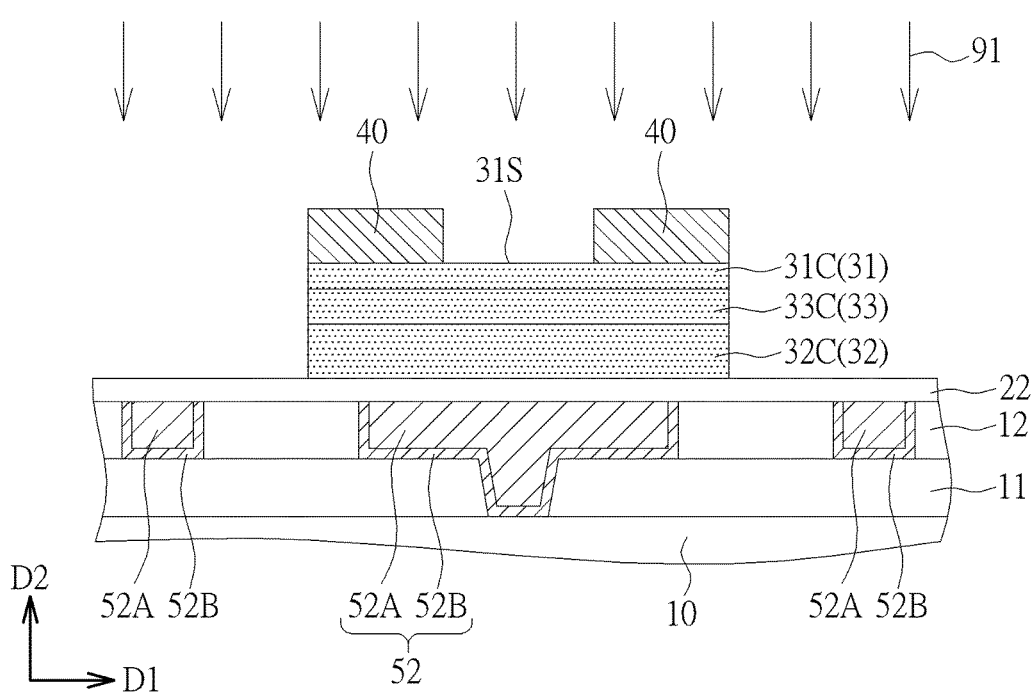
FIG. 14 is a schematic drawing illustrating a manufacturing method of an oxide semiconductor device according to a seventh embodiment of the present invention.

Please refer to FIG. 14. FIG. 14 is a schematic drawing illustrating a manufacturing method of an oxide semiconductor device according to a seventh embodiment of the present invention. As shown in FIG. 14, the difference between this embodiment and the sixth embodiment mentioned above is that the source/drain electrodes 40 may be formed before the first flattening process 91 for reducing the influence of the process of forming the source/drain electrodes 40 on the roughness of the first top surface 31S of the first oxide semiconductor channel layer 31C.

To summarize the above descriptions, in the manufacturing method of the oxide semiconductor device according to the present invention, the flattening process is performed on the top surface of the oxide semiconductor layer before the step of forming the gate insulation layer for reducing the interface roughness between the oxide semiconductor layer and the gate insulation layer. The reliability performances of the oxide semiconductor device may be enhanced accordingly. Additionally, each oxide semiconductor layer in the oxide semiconductor layer stack structure may be treated by the flattening process for further reducing the interface roughness between the oxide semiconductor layer and the gate insulation layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of an oxide semiconductor device, comprising:
   forming a first oxide semiconductor layer on a substrate;
   forming a gate insulation layer on the first oxide semiconductor layer; and
   performing a first flattening process on a top surface of the first oxide semiconductor layer before the step of forming the gate insulation layer, wherein a roughness of the top surface of the first oxide semiconductor layer after the first flattening process is smaller than the roughness of the top surface of the first oxide semiconductor layer before the first flattening process, wherein the first flattening process comprises a plasma treatment, a gaseous mixture used in the plasma treatment comprises xenon and hydrogen, and the hydrogen concentration in the gaseous mixture is lower than the xenon concentration in the gaseous mixture.

2. The manufacturing method of the oxide semiconductor device according to claim 1, wherein a process temperature of the first flattening process is lower than or equal to 400° C.

3. The manufacturing method of the oxide semiconductor device according to claim 1, further comprising:
   forming a second oxide semiconductor layer on the substrate before the step of forming the first oxide semiconductor layer, wherein at least a part of the first oxide semiconductor layer is formed on the second oxide semiconductor layer; and
   performing a second flattening process on a top surface of the second oxide semiconductor layer before the step of forming the first oxide semiconductor layer, wherein a roughness of the top surface of the second oxide semiconductor layer after the second flattening process is smaller than the roughness of the top surface of the second oxide semiconductor layer before the second flattening process.

4. The manufacturing method of the oxide semiconductor device according to claim 3, further comprising:
   forming a third oxide semiconductor layer on the second oxide semiconductor layer before the step of forming the first oxide semiconductor layer, wherein at least a part of the first oxide semiconductor layer is formed on the third oxide semiconductor layer; and
   performing a third flattening process on a top surface of the third oxide semiconductor layer before the step of forming the first oxide semiconductor layer, wherein a roughness of the top surface of the third oxide semiconductor layer after the third flattening process is smaller than the roughness of the top surface of the third oxide semiconductor layer before the third flattening process.

5. The manufacturing method of the oxide semiconductor device according to claim 4, further comprising:

performing a patterning process to the second oxide semiconductor layer and the third oxide semiconductor layer before the step of forming the first oxide semiconductor layer, wherein the second oxide semiconductor layer and the third oxide semiconductor layer are patterned to be a second oxide semiconductor channel layer and a third oxide semiconductor channel layer respectively.

6. The manufacturing method of the oxide semiconductor device according to claim 5, wherein the third flattening process is performed before the patterning process.

7. The manufacturing method of the oxide semiconductor device according to claim 5, wherein the third flattening process is performed after the patterning process.

8. The manufacturing method of the oxide semiconductor device according to claim 5, wherein the patterning process is further performed to the first oxide semiconductor layer before the step of forming the gate insulation layer, and the first oxide semiconductor layer is patterned to be a first oxide semiconductor channel layer.

9. The manufacturing method of the oxide semiconductor device according to claim 8, wherein the first flattening process is performed before the patterning process.

10. The manufacturing method of the oxide semiconductor device according to claim 8, wherein the first flattening process is performed after the patterning process.

11. The manufacturing method of the oxide semiconductor device according to claim 8, further comprising:
    forming source/drain electrodes on the first oxide semiconductor layer before the step of forming the gate insulation layer.

12. The manufacturing method of the oxide semiconductor device according to claim 11, wherein the source/drain electrodes are formed after the first flattening process.

13. The manufacturing method of the oxide semiconductor device according to claim 11, wherein the source/drain electrodes are formed before the first flattening process.

14. The manufacturing method of the oxide semiconductor device according to claim 4, further comprising:
    forming source/drain electrodes on the third oxide semiconductor layer before the step of forming the first oxide semiconductor layer, wherein a part of the first oxide semiconductor layer is formed on the source/drain electrodes.

15. The manufacturing method of the oxide semiconductor device according to claim 4, wherein the second flattening process and the third flattening process comprise a plasma treatment respectively.

16. The manufacturing method of the oxide semiconductor device according to claim 15, wherein a gaseous mixture used in the plasma treatment comprises xenon and/or hydrogen.

17. A manufacturing method of an oxide semiconductor device, comprising:
    forming a first oxide semiconductor layer on a substrate;
    forming a gate insulation layer on the first oxide semiconductor layer; and
    performing a first flattening process on a top surface of the first oxide semiconductor layer before the step of forming the gate insulation layer, wherein a roughness of the top surface of the first oxide semiconductor layer after the first flattening process is smaller than the roughness of the top surface of the first oxide semiconductor layer before the first flattening process, wherein the first flattening process comprises a plasma treatment, and a gaseous mixture used in the plasma treatment comprises xenon and/or hydrogen.

18. A manufacturing method of an oxide semiconductor device, comprising:
    forming a first oxide semiconductor layer on a substrate;
    forming a gate insulation layer on the first oxide semiconductor layer;
    performing a first flattening process on a top surface of the first oxide semiconductor layer before the step of forming the gate insulation layer, wherein a roughness of the top surface of the first oxide semiconductor layer after the first flattening process is smaller than the roughness of the top surface of the first oxide semiconductor layer before the first flattening process,
    forming a second oxide semiconductor layer on the substrate before the step of forming the first oxide semiconductor layer, wherein at least a part of the first oxide semiconductor layer is formed on the second oxide semiconductor layer;
    performing a second flattening process on a top surface of the second oxide semiconductor layer before the step of forming the first oxide semiconductor layer, wherein a roughness of the top surface of the second oxide semiconductor layer after the second flattening process is smaller than the roughness of the top surface of the second oxide semiconductor layer before the second flattening process,
    forming a third oxide semiconductor layer on the second oxide semiconductor layer before the step of forming the first oxide semiconductor layer, wherein at least a part of the first oxide semiconductor layer is formed on the third oxide semiconductor layer;
    performing a third flattening process on a top surface of the third oxide semiconductor layer before the step of forming the first oxide semiconductor layer, wherein a roughness of the top surface of the third oxide semiconductor layer after the third flattening process is smaller than the roughness of the top surface of the third oxide semiconductor layer before the third flattening process; and
    performing a patterning process to the second oxide semiconductor layer and the third oxide semiconductor layer before the step of forming the first oxide semiconductor layer, wherein the second oxide semiconductor layer and the third oxide semiconductor layer are patterned to be a second oxide semiconductor channel layer and a third oxide semiconductor channel layer respectively, and the third flattening process is performed after the patterning process.

* * * * *